(12) United States Patent
Muñoz Hernández et al.

(10) Patent No.: US 12,375,104 B2
(45) Date of Patent: Jul. 29, 2025

(54) COMPRESSION AND DISTRIBUTION OF METEOROLOGICAL DATA USING MACHINE LEARNING

(71) Applicant: The Boeing Company, Arlington, VA (US)

(72) Inventors: Andrés Muñoz Hernández, Munich (DE); Manuel Polaina Morales, Munich (DE); Alejandro Güemes Jimenez, Madrid (ES)

(73) Assignee: The Boeing Company, Arlington, VA (US)

( * ) Notice: Subject to any disclaimer, the term of this patent is extended or adjusted under 35 U.S.C. 154(b) by 227 days.

(21) Appl. No.: 18/338,320

(22) Filed: Jun. 20, 2023

(65) Prior Publication Data

US 2024/0014827 A1 Jan. 11, 2024

(30) Foreign Application Priority Data

Jul. 5, 2022 (EP) .................................... 22382645

(51) Int. Cl.
*H03M 7/30* (2006.01)
(52) U.S. Cl.
CPC ....... *H03M 7/6094* (2013.01); *H03M 7/6005* (2013.01); *H03M 7/6011* (2013.01)
(58) Field of Classification Search
CPC ........ H03M 7/30; H03M 7/70; H03M 7/6094; H03M 7/6005; H03M 7/6011; H03M 7/3082
See application file for complete search history.

(56) References Cited

U.S. PATENT DOCUMENTS 5,991,451 A * 11/1999 Keith ............... H03M 7/42
382/246
7,573,406 B2 * 8/2009 Hellman ............ H04N 19/42
341/67

(Continued)

FOREIGN PATENT DOCUMENTS

CN 111091243 5/2020

(Continued)

OTHER PUBLICATIONS

EP Search Report for EP Patent Application No. 22382645.4 dated Feb. 1, 2023.

(Continued)

*Primary Examiner* — Lam T Mai
(74) *Attorney, Agent, or Firm* — Kunzler Bean & Adamson

(57) ABSTRACT

Apparatuses, methods, systems, and program products are disclosed for compression and distribution of meteorological data using machine learning. An apparatus includes a processor and a memory that stores code executable by the processor to receive a raw meteorological data set for a time frame, the raw meteorological data set comprising a plurality of dimensions. The code is executable by the processor to compress the raw meteorological data set using a machine learning encoding model to create an encoded meteorological data set that has a storage size that is smaller than a storage size of the raw meteorological data set, wherein the encoded meteorological data set can be decoded to create a decoded meteorological data set that is substantially similar to the raw meteorological data set. The code is executable by the processor to make the encoded meteorological data set accessible to one or more end users.

20 Claims, 5 Drawing Sheets

(56) References Cited

U.S. PATENT DOCUMENTS

| | | | | |
|---|---|---|---|---|
| 7,612,694 | B1* | 11/2009 | Schneider | H03M 7/04 |
| | | | | 341/51 |
| 7,791,513 | B2* | 9/2010 | Monro | H03M 7/4006 |
| | | | | 341/107 |
| 8,144,048 | B2* | 3/2012 | Bunch | G01S 13/953 |
| | | | | 342/26 B |
| 8,279,934 | B2* | 10/2012 | Medford | H04N 19/436 |
| | | | | 375/240.2 |
| 8,755,444 | B2* | 6/2014 | Wei | H04N 19/91 |
| | | | | 375/240.26 |
| 11,050,436 | B2* | 6/2021 | Lasch | G06F 16/2282 |
| 11,870,467 | B2* | 1/2024 | Xu | H03M 7/3066 |
| 2007/0127580 | A1* | 6/2007 | Lei | G10L 19/0017 |
| | | | | 704/E19.044 |
| 2009/0016453 | A1* | 1/2009 | Monro | H03M 7/30 |
| | | | | 375/241 |
| 2010/0085218 | A1* | 4/2010 | Monro | H03M 7/30 |
| | | | | 341/51 |
| 2010/0245167 | A1* | 9/2010 | Bunch | G01S 13/953 |
| | | | | 342/26 B |
| 2019/0312588 | A1* | 10/2019 | Sofia | H03M 7/6011 |
| 2019/0392258 | A1* | 12/2019 | Liu | G06F 18/24143 |
| 2021/0092174 | A1* | 3/2021 | Lin | G06F 3/061 |
| 2021/0297708 | A1* | 9/2021 | Swaminathan | H04N 21/274 |
| 2022/0284282 | A1* | 9/2022 | Vitthaladevuni | G06T 9/002 |
| 2023/0110117 | A1* | 4/2023 | Arik | G06N 3/0895 |
| | | | | 706/25 |
| 2023/0299788 | A1* | 9/2023 | Agustsson | G06N 3/045 |
| | | | | 341/94 |
| 2023/0315704 | A1* | 10/2023 | Walters | G06F 16/2228 |
| | | | | 707/741 |
| 2024/0378483 | A1* | 11/2024 | Pandev | G06N 20/00 |

OTHER PUBLICATIONS

Sriram et al., "DeepComp: A Hybrid Framework for Data Compression Using Attention Coupled Autoencoder", Arabian Journal for Science and Engineering, Jul. 7, 2022, pp. 10395-10410, 2022.
Madhukar et al., "DSSAE-BBOA: deep learning-based weather big data analysis and visualization", Springer Science and Business Media, LLC., May 20, 2021, pp. 27471-27493, 2021.
Klamponas et al., "Autoencoder-Driven Weather Clustering for Source Estimation during Nuclear Events", Institute of Informatics and Telecommunications, National Centre for Scientific Research, Jan. 16, 2018, pp. 1-22.

* cited by examiner

COMPRESSION AND DISTRIBUTION OF METEOROLOGICAL DATA USING MACHINE LEARNING

FIELD

This invention relates to data compression and more particularly relates to compression and distribution of meteorological data using machine learning.

BACKGROUND

In the age of big data, the way data is managed, stored, and shared has become of utmost importance. Managing a large amount of information requires having sufficient storage space and the ability to transmit the data efficiently. Among the many examples that can be found in industry, the case of meteorological data is especially relevant. As a rough estimate, a single sample of weather data covering the entire Earth's surface and the pressure levels of interest for aviation, including velocity and temperature information, requires two or three gigabytes of storage capacity, depending on the numerical accuracy.

The data begins to accumulate rapidly as more timestamps are considered, making the handling of the datasets complex in situations where bandwidth in the communication channel or storage at the receiving end are limited. In modern aviation and air traffic systems, these situations can become more frequent as, for example, small, unmanned air vehicles with reduced storage and complex communication interactions with ground stations may require weather information to process their required trajectory more efficiently and accurately.

SUMMARY

The subject matter of the present application provides examples of compression and distribution of meteorological data using machine learning that overcome the above-discussed shortcomings of prior art techniques. The subject matter of the present application has been developed in response to the present state of the art, and in particular, in response to shortcomings of conventional systems.

In one embodiment, an apparatus includes a processor and a memory that stores code executable by the processor to receive a raw meteorological data set for a time frame, the raw meteorological data set comprising a plurality of dimensions. In one embodiment, the code is executable by the processor to compress the raw meteorological data set using a machine learning encoding model to create an encoded meteorological data set that has a storage size that is smaller than a storage size of the raw meteorological data set, wherein the encoded meteorological data set can be decoded to create a decoded meteorological data set that is substantially similar to the raw meteorological data set. In one embodiment, the code is executable by the processor to make the encoded meteorological data set accessible to one or more end users. The preceding subject matter of this paragraph characterizes example 1 of the present disclosure.

In one embodiment, the machine learning encoding model comprises a nonlinear machine learning model, the nonlinear machine learning model comprising one of a fully-connected autoencoder model and a convolutional autoencoder model. The preceding subject matter of this paragraph characterizes example 2 of the present disclosure, wherein example 2 also includes the subject matter according to example 1, above.

In one embodiment, the machine learning encoding model comprises a linear machine learning model, the linear machine learning model comprising a proper orthogonal decomposition model. The preceding subject matter of this paragraph characterizes example 3 of the present disclosure, wherein example 3 also includes the subject matter according to example 1, above.

In one embodiment, the code is executable by the processor to select the machine learning encoding model based on the physical characteristics of the raw meteorological data set. The preceding subject matter of this paragraph characterizes example 4 of the present disclosure, wherein example 4 also includes the subject matter according to example 1, above.

In one embodiment, the code is executable by the processor to train the machine learning encoding model using historical meteorological data. The preceding subject matter of this paragraph characterizes example 5 of the present disclosure, wherein example 5 also includes the subject matter according to example 1, above.

In one embodiment, the code is executable by the processor to associate a type of the machine learning encoding model used to create the encoded meteorological data set with the encoded meteorological data set for use in decoding the encoded meteorological data set. The preceding subject matter of this paragraph characterizes example 6 of the present disclosure, wherein example 6 also includes the subject matter according to example 1, above.

In one embodiment, the code is executable by the processor to determine a subset of the plurality of dimensions for the machine learning encoding model to encode. The preceding subject matter of this paragraph characterizes example 7 of the present disclosure, wherein example 7 also includes the subject matter according to example 1, above.

In one embodiment, the code is executable by the processor to scale the raw meteorological data set with respect to the second-order statistics of the raw meteorological data set prior to compressing the raw meteorological data set using the machine learning encoding model. The preceding subject matter of this paragraph characterizes example 8 of the present disclosure, wherein example 8 also includes the subject matter according to example 1, above.

In one embodiment, the code is executable by the processor to make the encoded meteorological data set accessible to one or more end users by streaming the encoded meteorological data set to the one or more end users via a distributed computing system. The preceding subject matter of this paragraph characterizes example 9 of the present disclosure, wherein example 9 also includes the subject matter according to example 1, above.

In one embodiment, the code is executable by the processor to make the encoded meteorological data set accessible to one or more end users by storing the encoded meteorological data set in a distributed file system that is accessible to the one or more end users. The preceding subject matter of this paragraph characterizes example 10 of the present disclosure, wherein example 10 also includes the subject matter according to example 1, above.

In one embodiment, the raw meteorological data set is received from a streaming source in real time and comprises at least an air velocity dimension and an air temperature dimension. The preceding subject matter of this paragraph characterizes example 11 of the present disclosure, wherein example 11 also includes the subject matter according to example 1, above.

In one embodiment, the one or more end users comprises one or more of an aircraft, a flight control system, a ground-based flight management system, and an unmanned aerial vehicle. The preceding subject matter of this paragraph characterizes example 12 of the present disclosure, wherein example 12 also includes the subject matter according to example 1, above.

In one embodiment, a method includes receiving a raw meteorological data set for a time frame, the raw meteorological data set comprising a plurality of dimensions. In one embodiment, the method includes compressing the raw meteorological data set using a machine learning encoding model to create an encoded meteorological data set that has a storage size that is smaller than a storage size of the raw meteorological data set, wherein the encoded meteorological data set can be decoded to create a decoded meteorological data set that is substantially similar to the raw meteorological data set. In one embodiment, the method includes making the encoded meteorological data set accessible to one or more end users. The preceding subject matter of this paragraph characterizes example 13 of the present disclosure.

In one embodiment, the machine learning encoding model comprises a nonlinear machine learning model, the nonlinear machine learning model comprising one of a fully-connected autoencoder model and a convolutional autoencoder model. The preceding subject matter of this paragraph characterizes example 14 of the present disclosure, wherein example 14 also includes the subject matter according to example 13, above.

In one embodiment, the machine learning encoding model comprises a linear machine learning model, the linear machine learning model comprising a proper orthogonal decomposition model. The preceding subject matter of this paragraph characterizes example 15 of the present disclosure, wherein example 15 also includes the subject matter according to example 13, above.

In one embodiment, the method includes selecting the machine learning encoding model based on the physical characteristics of the raw meteorological data set. The preceding subject matter of this paragraph characterizes example 16 of the present disclosure, wherein example 16 also includes the subject matter according to example 13, above.

In one embodiment, the method includes training the machine learning encoding model using historical meteorological data. The preceding subject matter of this paragraph characterizes example 17 of the present disclosure, wherein example 17 also includes the subject matter according to example 13, above.

In one embodiment, the method includes associating a type of the machine learning encoding model used to create the encoded meteorological data set with the encoded meteorological data set for use in decoding the encoded meteorological data set. The preceding subject matter of this paragraph characterizes example 18 of the present disclosure, wherein example 18 also includes the subject matter according to example 13, above.

In one embodiment, the method includes determining a subset of the plurality of dimensions for the machine learning encoding model to encode. The preceding subject matter of this paragraph characterizes example 19 of the present disclosure, wherein example 19 also includes the subject matter according to example 13, above.

In one embodiment, a program product includes a non-transitory computer readable storage medium storing code, the code being configured to be executable by a processor to perform operations. In one embodiment, the operations include receiving a raw meteorological data set for a time frame, the raw meteorological data set comprising a plurality of dimensions. In one embodiment, the operations includes compressing the raw meteorological data set using a machine learning encoding model to create an encoded meteorological data set that has a storage size that is smaller than a storage size of the raw meteorological data set, wherein the encoded meteorological data set can be decoded to create a decoded meteorological data set that is substantially similar to the raw meteorological data set. In one embodiment, the operations include making the encoded meteorological data set accessible to one or more end users. The preceding subject matter of this paragraph characterizes example 20 of the present disclosure.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1:
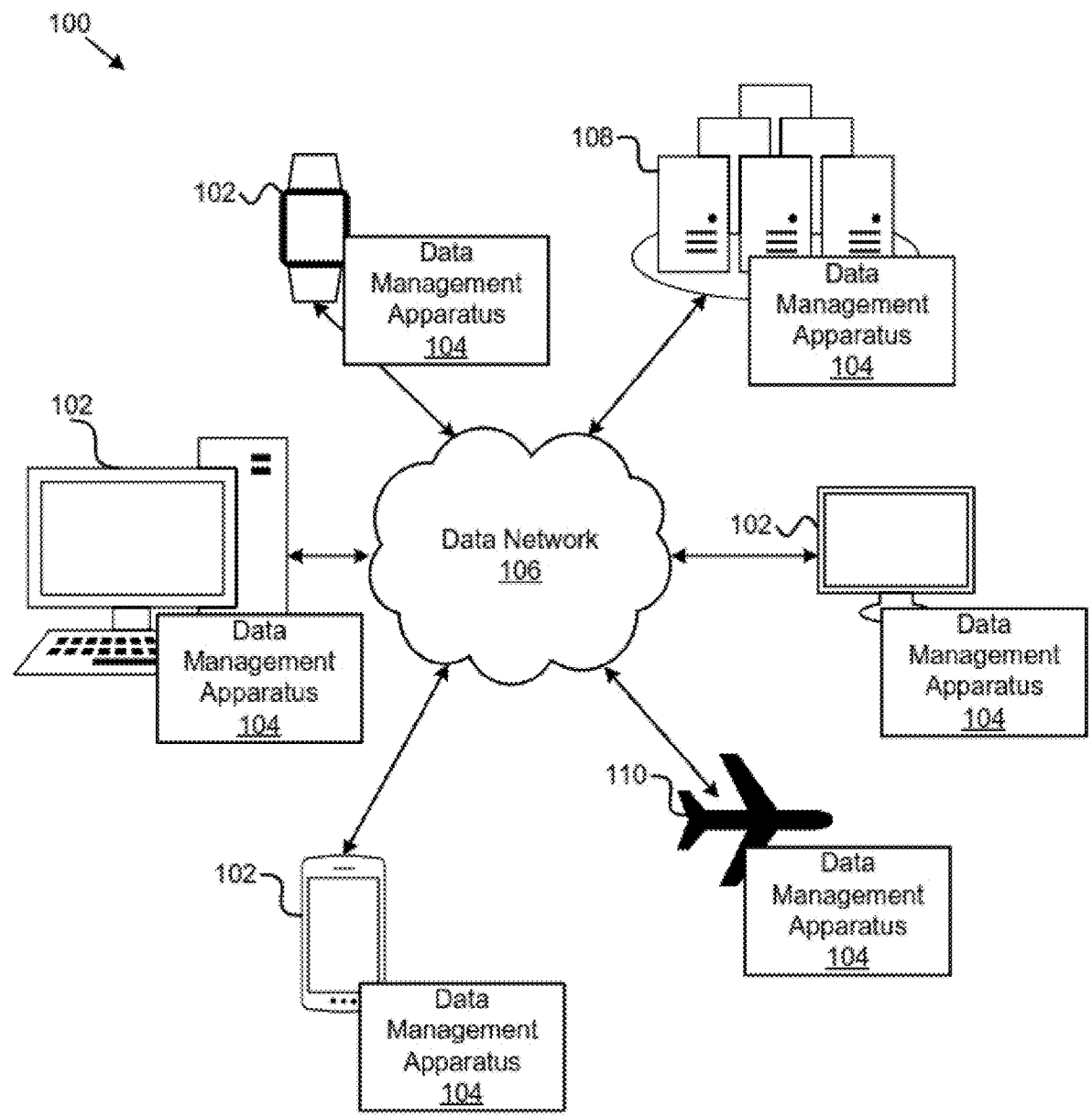
FIG. 1 is a schematic block diagram illustrating one embodiment of a system for compression and distribution of meteorological data using machine learning.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

These features and advantages of the embodiments will become more fully apparent from the following description and appended claims or may be learned by the practice of embodiments as set forth hereinafter. As will be appreciated by one skilled in the art, aspects of the present invention may be embodied as a system, method, and/or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having program code embodied thereon.

Many of the functional units described in this specification have been labeled as modules, to more particularly emphasize their implementation independence. For example, a module may be implemented as a hardware circuit comprising custom very large scale integrated ("VLSI") circuits or gate arrays, off-the-shelf semiconductors such as logic chips, transistors, or other discrete components. A module may also be implemented in programmable hardware devices such as a field programmable gate array ("FPGA"), programmable array logic, programmable logic devices or the like.

Modules may also be implemented in software for execution by various types of processors. An identified module of program code may, for instance, comprise one or more physical or logical blocks of computer instructions which may, for instance, be organized as an object, procedure, or function. Nevertheless, the executables of an identified module need not be physically located together but may comprise disparate instructions stored in different locations which, when joined logically together, comprise the module and achieve the stated purpose for the module.

Indeed, a module of program code may be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different storage devices, and may exist, at least partially, merely as electronic signals on a system or network. Where a module or portions of a module are implemented in software, the program code may be stored and/or propagated on in one or more computer readable medium(s).

The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture ("ISA") instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider). In some embodiments, electronic circuitry including, for example, programmable logic circuitry, field-programmable gate arrays ("FPGA"), or programmable logic arrays ("PLA") may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present invention. In this regard, each block in the schematic flowchart diagrams and/or schematic block diagrams may represent a module, segment, or portion of code, which comprises one or more executable instructions of the program code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and program code.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C. As used herein, "a member selected from the group consisting of A, B, and C," includes one and only one of A, B, or C, and excludes combinations of A, B, and C." As used herein, "a member selected from the group consisting of A, B, and C and combinations thereof" includes only A, only B, only C, a combination of A and B, a combination of B and C, a combination of A and C or a combination of A, B and C.

Meteorological data describing the atmosphere's current and forecasted states requires massive storage resources to handle datasets in the size of multiple terabytes. In general, the subject matter herein presents systems based on data-driven methods to encode and decode meteorological data so that the data can be compressed, shared, and stored within communication systems that have low memory and/or bandwidth characteristics. Specifically, subject matter herein describes how to encode the data using different algorithms and recover weather data from the encoded format to its original one with low information loss. This reduced-size format allows for easier sharing and storing of meteorological information between different systems and eases its employment with low-order models that are not able manage massive numbers of inputs.

The described invention proposes a methodology for encoding the available large weather files to a reduced dataset of just a few parameters, requiring just a few bytes of storage. This reduces drastically the memory and bandwidth requirements needed for their storage and distribution, respectively. This methodology also shows how the full weather definition can be decoded and retrieved from these parameters, ready to be used for any required calculation and incurring on a reduced information loss.

Conventional approaches to sharing and distributing weather data requires significant computational resources. For example, this may be the case for the National Oceanic and Atmospheric Administration ("NOAA") or the European Centre for Medium-range Weather Forecasts ("ECMWF"), which operate large-scale data handling systems that store petabytes of operational and research weather data following their established standards.

These data may be stored and consumed according to a reduction in the spatial and/or temporal resolution. However, depending on the target application, this information loss cannot be assumed. Another possibility conventionally applied is to compress the data with file-compressing tools through open-source or proprietary software (e.g., RAR, ZIP, or the like) for easing data distribution in contexts of reduced bandwidth or storage capabilities. However, because these tools target the compression of the file itself, the performance depends explicitly on the format with which the data is stored. Moreover, these methods do not exploit the advantages of the physical information they are compressing, which is highly correlated. In addition, these methods do not usually offer a compression ratio greater than ten, which limits the flexibility of the data compression characteristics for specific applications.

To overcome the shortcomings of the conventional solutions, the methodology presented herein employs data-driven techniques to encode and decode weather information within a distribution system with reduced information loss. This system could be deployed between two elements of a real-time communication system without requiring significant memory resources on any endpoints or significant available bandwidth in the communication channel.

Additionally, the solutions described herein consider the physical information of the weather system being used, thus incurring minimum losses related to the entropy of the information. This allows the communicated weather data to be employed for any calculations in the receiving end without significant accuracy losses.

FIG. 1 is a schematic block diagram illustrating one embodiment of a general information system 100 for compression and distribution of meteorological data using machine learning. In one embodiment, the system 100 includes one or more information handling devices 102, one or more data management apparatuses 104, one or more data networks 106, one or more servers 108, and one or more aircraft 110. In certain embodiments, even though a specific number of information handling devices 102, data management apparatuses 104, data networks 106, and servers 108 are depicted in FIG. 1, one of skill in the art will recognize, in light of this disclosure, that any number of information handling devices 102, data management apparatuses 104, data networks 106, servers 108, and aircraft 110 may be included in the system 100.

In one embodiment, the system 100 includes one or more information handling devices 102. The information handling devices 102 may be embodied as one or more of a desktop computer, a laptop computer, a tablet computer, a smart phone, a smart speaker (e.g., Amazon Echo®, Google Home®, Apple HomePod®), an Internet of Things device, a security system, a set-top box, a gaming console, a smart TV, a smart watch, a fitness band or other wearable activity tracking device, an optical head-mounted display (e.g., a virtual reality headset, smart glasses, head phones, or the like), a High-Definition Multimedia Interface ("HDMI") or other electronic display dongle, a personal digital assistant, a digital camera, a video camera, or another computing device comprising a processor (e.g., a central processing unit ("CPU"), a processor core, a field programmable gate array ("FPGA") or other programmable logic, an application specific integrated circuit ("ASIC"), a controller, a microcontroller, and/or another semiconductor integrated circuit device), a volatile memory, and/or a non-volatile storage medium, a display, a connection to a display, and/or the like.

In certain embodiments, the information handling devices 102 are part of a flight management system, a weather monitoring system, and/or other aeronautical data provider system that captures, monitors, accesses, stores, and provides aeronautical data such as meteorological data, flight data (e.g., velocity, altitude, estimated time of arrival, or the like), and/or the like.

In general, in one embodiment, the data management apparatus 104 is configured to receive a raw meteorological data set for a time frame, the raw meteorological data set comprising a plurality of dimensions, compress the raw meteorological data set using a machine learning encoding model to create an encoded meteorological data set that has a storage size that is smaller than a storage size of the raw meteorological data set, and make the encoded meteorological data set accessible to one or more end users. The data management apparatus 104 is described in more detail below with reference to FIGS. 2 and 3.

In one embodiment, the data management apparatus 104 is part of a flight management system that may be located on board an aircraft 110, on a ground control system, and/or some combination of both. In certain embodiments, the data management apparatus 104 may include a hardware device such as a secure hardware dongle or other hardware appliance device (e.g., a set-top box, a network appliance, or the like) that attaches to a device such as a head mounted display, a laptop computer, a server 108, a tablet computer, a smart phone, a security system, a network router or switch, or the like, either by a wired connection (e.g., a universal serial bus ("USB") connection) or a wireless connection (e.g., Bluetooth®, Wi-Fi, near-field communication ("NFC"), or the like); that attaches to an electronic display device (e.g., a television or monitor using an HDMI port, a DisplayPort port, a Mini DisplayPort port, VGA port, DVI port, or the like); and/or the like. A hardware appliance of the data management apparatus 104 may include a power interface, a wired and/or wireless network interface, a graphical interface that attaches to a display, and/or a semiconductor integrated circuit device as described below, configured to perform the functions described herein regarding the data management apparatus 104.

The data management apparatus 104, in such an embodiment, may include a semiconductor integrated circuit device (e.g., one or more chips, die, or other discrete logic hardware), or the like, such as a field-programmable gate array ("FPGA") or other programmable logic, firmware for an FPGA or other programmable logic, microcode for execution on a microcontroller, an application-specific integrated circuit ("ASIC"), a processor, a processor core, or the like. In one embodiment, the data management apparatus 104 may be mounted on a printed circuit board with one or more electrical lines or connections (e.g., to volatile memory, a non-volatile storage medium, a network interface, a peripheral device, a graphical/display interface, or the like). The hardware appliance may include one or more pins, pads, or other electrical connections configured to send and receive data (e.g., in communication with one or more electrical lines of a printed circuit board or the like), and one or more hardware circuits and/or other electrical circuits configured to perform various functions of the data management apparatus 104.

The semiconductor integrated circuit device or other hardware appliance of the data management apparatus 104, in certain embodiments, includes and/or is communicatively coupled to one or more volatile memory media, which may include but is not limited to random access memory ("RAM"), dynamic RAM ("DRAM"), cache, or the like. In one embodiment, the semiconductor integrated circuit device or other hardware appliance of the data management apparatus 104 includes and/or is communicatively coupled to one or more non-volatile memory media, which may include but is not limited to: NAND flash memory, NOR flash memory, nano random access memory (nano RAM or "NRAM"), nanocrystal wire-based memory, silicon-oxide based sub-10 nanometer process memory, graphene memory, Silicon-Oxide-Nitride-Oxide-Silicon ("SONOS"), resistive RAM ("RRAM"), programmable metallization cell ("PMC"), conductive-bridging RAM ("CBRAM"), magneto-resistive RAM ("MRAM"), dynamic RAM ("DRAM"), phase change RAM ("PRAM" or "PCM"), magnetic storage media (e.g., hard disk, tape), optical storage media, or the like.

The data network 106, in one embodiment, includes a digital communication network that transmits digital communications. The data network 106 may include a wireless network, such as a wireless cellular network, a local wireless network, such as a Wi-Fi network, a Bluetooth® network, a near-field communication ("NFC") network, an ad hoc network, and/or the like. The data network 106 may include a wide area network ("WAN"), a storage area network ("SAN"), a local area network ("LAN") (e.g., a home network), an optical fiber network, the internet, or other digital communication network. The data network 106 may include two or more networks. The data network 106 may include one or more servers, routers, switches, and/or other networking equipment. The data network 106 may also include one or more computer readable storage media, such as a hard disk drive, an optical drive, non-volatile memory, RAM, or the like.

The wireless connection may be a mobile telephone network. The wireless connection may also employ a Wi-Fi network based on any one of the Institute of Electrical and Electronics Engineers ("IEEE") 802.11 standards. Alternatively, the wireless connection may be a Bluetooth® connection. In addition, the wireless connection may employ a Radio Frequency Identification ("RFID") communication including RFID standards established by the International Organization for Standardization ("ISO"), the International Electrotechnical Commission ("IEC"), the American Society for Testing and Materials® (ASTM®), the DASH7™ Alliance, and EPCGlobal™.

The wireless connection may be an infrared connection including connections conforming at least to the Infrared Physical Layer Specification ("IrPHY") as defined by the Infrared Data Association® ("IrDA"®). Alternatively, the wireless connection may be a cellular telephone network communication. All standards and/or connection types include the latest version and revision of the standard and/or connection type as of the filing date of this application.

The one or more servers 108, in one embodiment, may be embodied as blade servers, mainframe servers, tower servers, rack servers, and/or the like. The one or more servers 108 may be configured as mail servers, web servers, application servers, FTP servers, media servers, data servers, web servers, file servers, virtual servers, and/or the like. The one or more servers 108 may be communicatively coupled (e.g., networked) over a data network 106 to one or more information handling devices 102 and may be configured to store content and to execute or run video/audio conferencing and/or other online presentation algorithms, programs, applications, processes, and/or the like. The one or more servers 108 may be part of a flight management system maintained by an aviation agency, e.g., the federal aviation administration, an airline, an airport, and/or the like.

The aircraft 110, in one embodiment, may include civil and military aircraft such as a private airplane, a commercial airplane, a cargo airplane, a jet, a helicopter, a drone, and/or the like. One of skill in the art, in light of this disclosure, will recognize the various types of aircraft that may be used with the solutions proposed herein.

Figure 2:
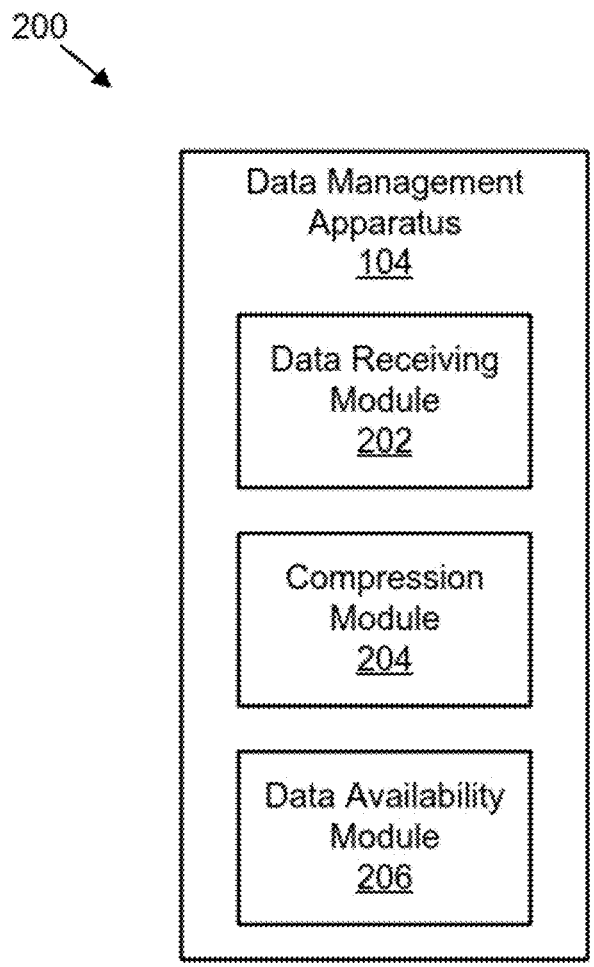
FIG. 2 depicts one embodiment of an apparatus for compression and distribution of meteorological data using machine learning.

FIG. 2 depicts one embodiment of an apparatus 200 for compression and distribution of meteorological data using machine learning. In one embodiment, the apparatus 200 includes an instance of a data management apparatus 104. The data management apparatus 104 may include embodiments of a data receiving module 202, a compression module 204, and a data availability module 206, which are described in more detail below.

In one embodiment, the data receiving module 202 is configured to receive a raw meteorological data set for a time frame, the raw meteorological data set comprising a plurality of dimensions. The raw meteorological data set may contain different types of data such as weather data, aeronautical data, and/or the like. The weather data, for example, may include different weather measurements such as air temperature, ambient temperature, pressure, humidity, moisture, air velocity, forecast data, historical data, and/or the like, for a particular time period, e.g., right now, ten seconds ago, a minute ago, an hour ago, and/or the like. The meteorological data set that the data receiving module 202 is a raw data set meaning the data has not been processed, cleaned, filtered, or the like.

The data receiving module 202 may receive the raw meteorological data set from weather stations, ground-based aeronautical data providers (e.g., streaming data providers managed by the FAA or Eurocontrol), and/or the like. The data receiving module 202 may receive or access real-time streaming meteorological data, pre-captured data, locally stored data, and/or the like.

In one embodiment, weather information is received from internal or external sources (e.g., NOAA, ECMWF, or the like). Further, any weather format or type can be used, such as any common weather data standard used within the industry. In certain embodiments, the weather data should contain, at least, air velocity and air temperature information for a three-dimensional grid.

In one embodiment, the compression module 204 compresses the raw meteorological data set using a machine learning encoding model to create an encoded meteorological data set that has a storage size that is smaller than a storage size of the raw meteorological data set. In one embodiment, the machine learning encoding model comprises a machine learning autoencoder, which is a type of artificial neural network used to learn efficient codings of unlabeled data, e.g., unsupervised learning.

For instance, examples of autoencoders that the compression module 204 may utilize may include a nonlinear fully-connected autoencoder ("FC-AE"), a nonlinear convolutional autoencoder ("C-AE"), or the like. Further, the compression module 204 may utilize various linear encoders including proper orthogonal decomposition ("POD"), or the like. As used herein, a POD encoder is a numerical method that enables a reduction in the complexity of computer intensive simulations by training a model based on simulation data, e.g., training data.

As used herein, nonlinear and or linear machine learning encoders are particularly applicable to compressing large data sets that have physical properties that are highly correlated, such as meteorological weather data, e.g., temperature, pressure, or the like. In such an embodiment, the encoder learns a representation (e.g., an encoding) for a set of data, typically for dimensionality reduction, by training the network to ignore insignificant data (e.g., "noise").

Specifically, a neural network architecture or other numerical methods can be designed to impose a bottleneck on the data that forces a compressed knowledge representation of the original input, e.g., the raw meteorological data set. If some sort of structure exists in the data (e.g., correlations between input features based on the physical properties of the data such as the relationship between air velocity and air temperature within a weather data set), this structure can be learned and consequently leveraged when forcing the input through the bottleneck. A bottleneck constrains the amount of information that can be traversed, forcing a learned compression of the input data.

The machine learning encoders encode the data in such a manner that the compression module 204 can decode the encoded data set, using the same or similar model that was used to encode the data, in a lossless manner to maintain the quality and accuracy of the important or desired features of the original data set, e.g., the data of interest such as air temperature, air velocity, or the like, while excluding other non-important or "noisy" data.

In one embodiment, a hyperparameter exploration may be used to determine the most suitable architecture of an autoencoder for our application, e.g., the number of hidden layers, the kernel size, the number of filters, the learning parameter, and/or the like. In one embodiment, the autoencoders utilize a loss function that is used to minimize the loss due to encoding (compressing) and decoding (decompressing) the data. In such an embodiment, the loss function may include a mean squared error between the raw meteorological data and the decoded meteorological data.

Alternatively, or additionally, a physics-informed autoencoder may be used to implement the solutions described herein. In one embodiment, the difference between a physics-informed autoencoder and a FC-AE, a C-AE, or a POD is the loss function that is used. For instance, for a physics-informed autoencoder, the loss function is designed as the residual between the prediction and the target to meet the conditions imposed by the set of equations describing the involved physics process.

In one embodiment, the compression module 204 selects a machine learning encoding model to encode the raw meteorological data set based on the physical characteristics of the raw meteorological data set. As used herein, physical characteristics of the data may refer to the specific variables included within the meteorological data set describing the applicable weather conditions e.g., pressure, temperature, wind velocity, density, and/or the like. Depending on the specific source employed to consume the meteorological data, or even on the specific interests of the user, some variables may or may not be included within the meteorological data set (e.g., a user may only be interested on the wind conditions and not on temperature evolution).

Due to the specific intrinsic physical characteristics of the variables included within the meteorological dataset, the selection of different encoding models may be used to maximize the accuracy in the compression and decompression of the data. In one embodiment, this is due to the different intrinsic value distributions of such physical variables across the different dimensions in which they are expressed (e.g., how the temperature changes on the different coordinate points and altitudes covered within the meteorological data set). For instance, a nonlinear machine learning encoding model such as a fully-connected autoencoder model may be better suited, trained, designed, or the like for a raw meteorological data set than a linear machine learning encoding model such as a proper orthogonal decomposition model based on the physical characteristics of the data in the data set, the dimensions of the data set, the correlations/relationships between the dimensions in the data set, and/or the like.

In one embodiment, the compression module 204 associates a type of the machine learning encoding model used to create the encoded meteorological data set with the encoded meteorological data set for use in decoding the encoded meteorological data set. In such an embodiment, the type may be indicated with an identifier such as an encoding model identifier, an encoding model version, an encoding model name, and/or the like. The compression module 204 may use the indicated type to select the corresponding machine learning decoding model for decoding the encoded data set.

In one embodiment, the compression module 204 determines a subset of a plurality of dimensions of the raw meteorological data set to encode using the machine learning encoding model. For instance, the raw meteorological data set may include multiple different dimensions, features, samples, parameters, or the like of various variables such as air temperature, air velocity, pressure, humidity, and/or the like. Accordingly, the compression module 204 may select a subset of the dimensions to encode, e.g., provide as input to a machine learning encoding model, based on user input, a configuration, a predefined selection of features/dimensions, a particular machine learning encoding model to be used to encode the data, and/or the like.

In one embodiment, the data availability module 206 is configured to make the encoded meteorological data set accessible to one or more end users, end devices, other systems, and/or the like. For instance, the data availability module 206 may make the decoded data set accessible via an application programming interface ("API"), a file sharing site, a remotely-accessible data store, and/or the like.

In one example embodiment, the data availability module 206 is configured to make the encoded meteorological data set accessible to one or more end users/devices in a distributed manner. For instance, the encoded or decoded meteorological data set may store and make accessible different pieces of the same dataset from different machines or devices.

In one embodiment, the data availability module 206 makes the encoded meteorological data set accessible by streaming the encoded meteorological data set to the one or more end users via a distributed computing system. In such an embodiment, the data availability module 206 may store or access the encoded meteorological data set via a plurality of different devices, computers, servers, or the like, which are configured to stream the encoded meteorological data set to one or more end users/devices. For instance, one or more ground-based aeronautical data providers may stream the encoded meteorological data set to an aircraft or other end user device.

Various technologies may be used to provide the streaming data such as Apache Kafka, which allows open streaming channels that communicate data from a number of different sources, one of them being datasets built and handled by a distributed computing software. For example, an Apache Kafka streaming channel could be set up that takes as input an Apache Spark data instance built in a distributed computing system. This streaming channel can then be consumed in a number of different ways depending on the desired configuration. The specific streaming implementation depends on the hardware configuration required for the communication, meaning that the streaming implementation may not be the same between, for example, two ground stations or between a ground station and an aircraft or between two different computers within the same network of a ground station. The technical requirements in each case may be different, and therefore the specifics of how to set up each implementation would be accordingly different.

In another example embodiment, the data availability module 206 is configured to make the encoded meteorological data set accessible to one or more end users/devices by storing the encoded meteorological data set in a distributed file system that is accessible to the one or more end users. The file system may be distributed among various devices, data centers, geographic locations, and/or the like, and remotely accessible, e.g., via the cloud, Internet, a virtual private network, and/or the like.

In one embodiment, the compression module 204 decodes the encoded meteorological data set prior to the data availability module 206 making the data accessible to end users. In other embodiments, the compression module 204 decodes the encoded meteorological data set on the end user device. In one embodiment, the one or more end users/devices comprises one or more of an aircraft, a flight control system, a ground-based flight management system, an unmanned aerial vehicle, a smart phone, a smart watch, a tablet computer, a laptop computer, a server, and/or the like.

In one embodiment, the ends users/devices utilize the decoded meteorological data set to make decisions during flight such as adjusting, modifying, estimating, confirming, updating and/or the like a flight path, determining an estimate time of arrival, and/or the like, which may occur on the fly, in real time. By encoding and decoding the weather data using the machine learning encoding models, only relevant weather data can be used, which reduces the complexity, processing, storage, and bandwidth requirements of the weather data, making it easier and more efficient to store, distribute, access, and use the weather data to make such decisions.

Figure 3:
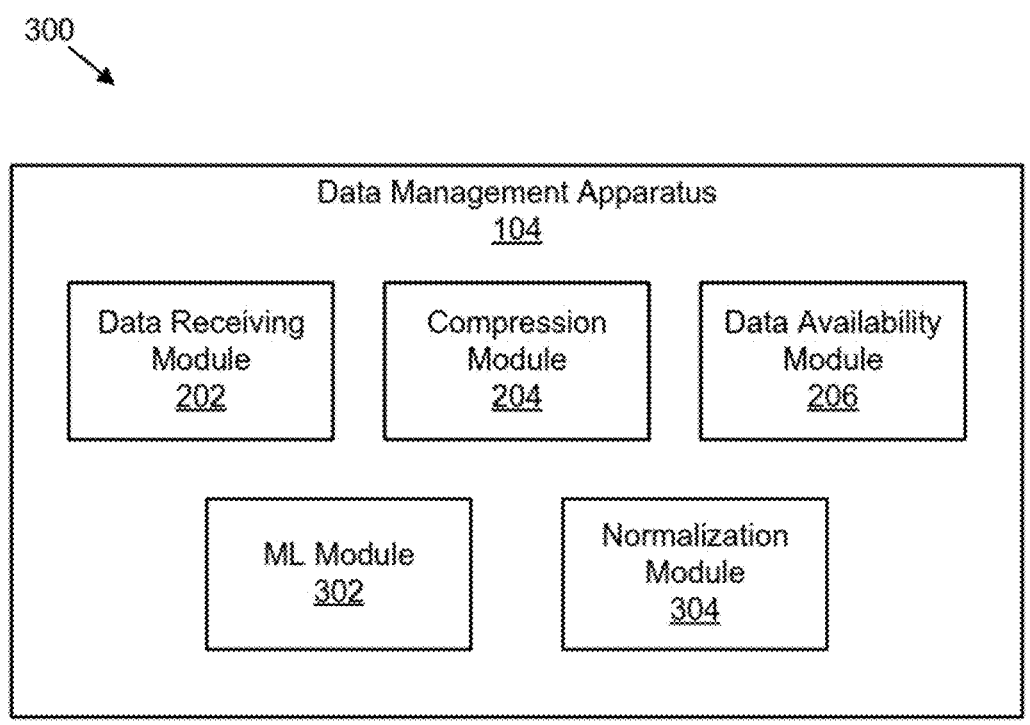
FIG. 3 depicts one embodiment of another apparatus for compression and distribution of meteorological data using machine learning.

FIG. 3 depicts one embodiment of an apparatus 300 for compression and distribution of meteorological data using machine learning. In one embodiment, the apparatus 300 includes an instance of a data management apparatus 104. The data management apparatus 104 may include embodiments of a data receiving module 202, a compression module 204, and a data availability module 206, which may be substantially similar to the data receiving module 202, the compression module 204, and the data availability module 206 described above. Furthermore, the data management apparatus 104 may include instances of an ML module 302 and a normalization module 404, which are described in more detail below.

In one embodiment, the ML module 302 is configured to train the machine learning encoding model using historical meteorological data. Machine learning, as used herein, refers to methods of data analysis that automates analytical model building. It is a branch of artificial intelligence based on the idea that systems can learn from data, identify patterns, and make decisions with minimal human intervention.

In one embodiment, the ML module 302 trains the machine learning encoding model on historical meteorological data, including historical weather data. Training the machine learning model may refer to providing an ML encoding algorithm (that is, the learning algorithm) with training data to learn from. The term ML model may refer to the model artifact that is created by the training process. In one embodiment, the training data contains the correct answer, which is known as a target or target attribute. The learning algorithm finds patterns in the training data that map the input data attributes to the target (the answer that you want to predict), and it outputs an ML model that captures these patterns. In this particular solution, the ML model comprises a trained machine learning encoding model that is configured for encoding/compressing raw meteorological data, and in particular weather data in a lossless manner.

In one embodiment, the normalization module 304 is configured to scale the raw meteorological data set by modifying, adjusting, organizing, or the like data from different sources to appear similar across records, fields, values, and/or the like, so that the data may be treated the same. For instance, different meteorological data providers may provide raw meteorological data in different formats, structures, and/or the like. To process the data, e.g., using the machine learning encoding model, the normalization module 304 may convert each data value, record, field, or the like to a standard form, format, structure, or the like so that raw meteorological data from different data providers can be treated or analyzed in the same manner. In one embodiment, the normalization module 404 scales the raw meteorological data set with respect to the second-order statistics of the raw meteorological data set prior to compressing the raw meteorological data set using the machine learning encoding model.

Figure 4:
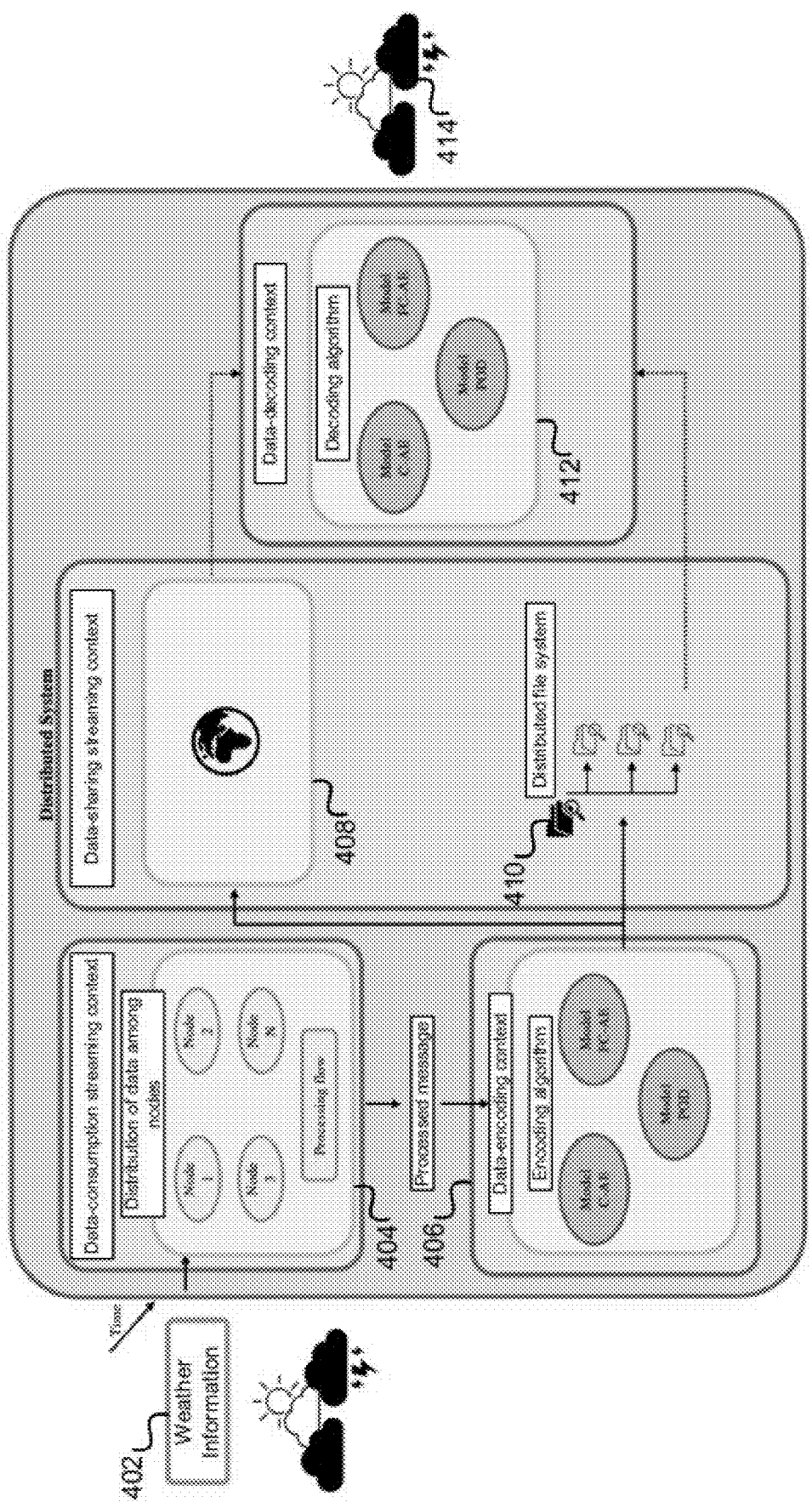
FIG. 4 depicts one embodiment of a system flow for compression and distribution of meteorological data using machine learning.

FIG. 4 depicts one embodiment of a system flow 400 for compression and distribution of meteorological data using machine learning. In one embodiment, the data receiving module 302 receives weather data 402 from an internal or external source (e.g., NOAA, ECMWF). Any weather format can be provided as the normalization module 304 may scale or normalize the data to a consistent format. In one embodiment, the weather data contains at least air velocity and air temperature information for a three-dimensional grid.

In further embodiments, the received weather data 402 may be processed 404 depending on the encoding/decoding technique selected, which may be different depending on the data itself. In one embodiment, the preprocessing technique may entail the normalization module 204 scaling the data with respect to the second-order statistics of the data used for the model fitting. In one embodiment, the received weather data 402 may be distributed among various nodes, either prior to or after normalization.

In one embodiment, at the data-encoding context 406, the compression module 204 selects a machine learning encoding model for encoding the received weather data. The compression module 204 may select the machine learning encoding model based on the physical properties or characteristics of the received weather data. The compression module 204 may feed or input the weather data to the selected encoding algorithm. Depending on the chosen compression ratio, e.g., how much the weather data size wants to be reduced, a real-valued vector is returned containing the encoded information.

In one embodiment, if the weather data is intended to be shared, which is the purpose of the system, the output vector from the previous encoding step is the actual shared information. This output vector has a size that is less than the initial weather data and is composed of numeric values for at least a few latent variables, e.g., around a dozen variables.

Different methods can be used to share the weather data, depending on the receiver being an internal or an external entity. In any of those cases, considering that the vector output occupies a few bytes, the bandwidth available for the connection is not a limiting concern. A distributed system may be utilized for establishing a data-sharing pool, in which the input data can be either output through a streaming context 408 (employing state-of-the-art tools such as Kafka) or stored for later use using a distributed file system 410.

In one embodiment, the purpose of these distributed system is to reduce the computational workload on the emitting/transmitting end by just requiring the establishment of a connection to the distributed system, which can be hosted on any remote instance. This distributed system may also establish a communication channel with the receiving end, which can rely on the established real-time streaming context or on any alternative required communication standard (e.g., certain drones may require specific communication standards for wider coverage or safety purposes).

In one embodiment, the compression module 204 decodes 412 the encoded weather data using the same or similar machine learning encoding model to create a decoded data set 414. In one embodiment, the encoded or decoded weather data can be employed for different purposes depending on the end of the communication channel. The emitting end can store the compressed weather data for future usage without incurring high memory or storage requirements or can rely on the distributed file system. The receiving end can employ the weather data in its compressed form or can employ its full definition by decoding the encoded data set. To do so, hard memory requirements can be skipped by depending on the virtual memory ones, requiring just the capacity for running the decoding algorithm and employing the retrieved data for any further calculation.

Figure 5:
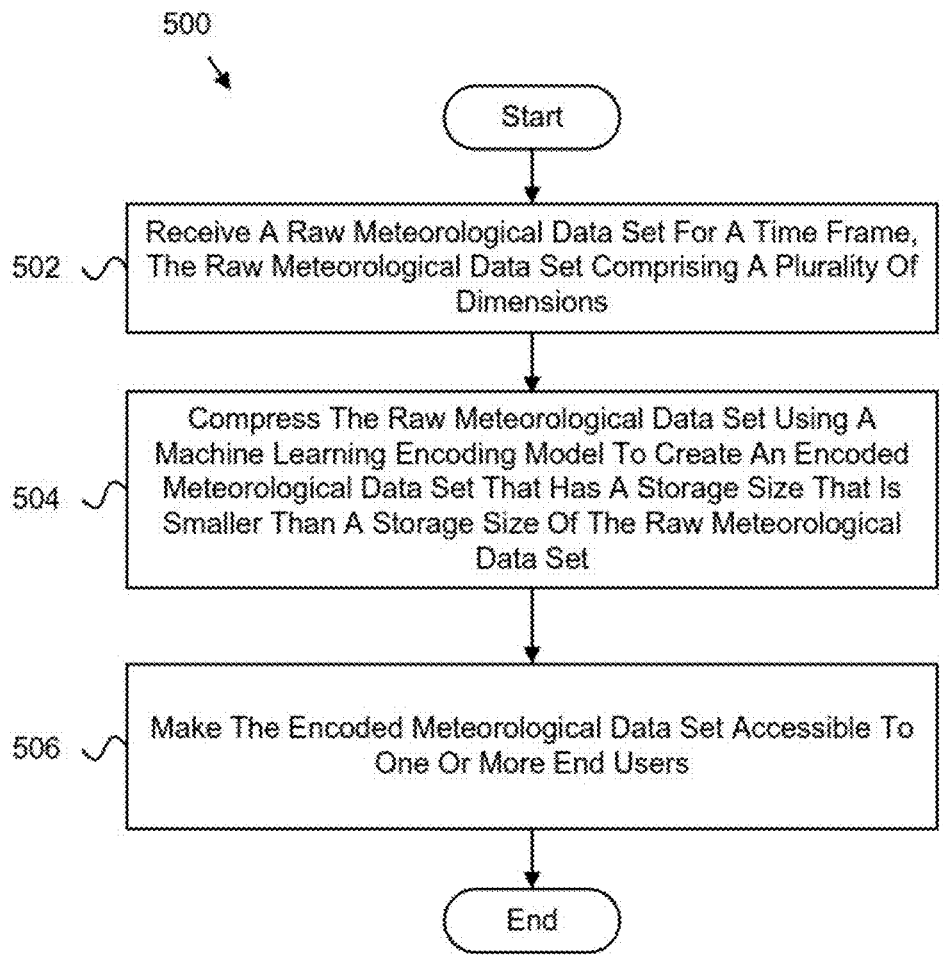
FIG. 5 is a schematic block diagram illustrating one embodiment of a method for compression and distribution of meteorological data using machine learning.

FIG. 5 depicts one embodiment of a method 500 for compression and distribution of meteorological data using machine learning. In one embodiment, the method 500 begins and receives 502 a raw meteorological data set for a time frame, the raw meteorological data set comprising a plurality of dimensions.

In one embodiment, the method 500 compresses 504 the raw meteorological data set using a machine learning encoding model to create an encoded meteorological data set that has a storage size that is smaller than a storage size of the raw meteorological data set, wherein the encoded meteorological data set can be decoded to create a decoded meteorological data set that is substantially similar to the raw meteorological data set.

In one embodiment, the method 500 makes 506 the encoded meteorological data set accessible to one or more end users, and the method 500 ends. In one embodiment, the data receiving module 202, the compression module 204, and the data availability module 206 perform the different steps of the method 500.

As described herein, the proposed solution describes a methodology that can be implemented for an end-to-end communication system so that full-scale weather data is transmitted and employed without incurring severe memory or bandwidth requirements. As discussed above, conventional solutions focus on different methodologies for encoding weather information with high accuracy in a lossless manner but that require high computational demand. On the other hand, the claimed solution proposes machine learning techniques for encoding and decoding data that are compatible with reduced memory and bandwidth scenarios, and a distributed system for the effective communication of the data that allows its employment in complex situations.

In one embodiment, the distributed system allows for data-sharing via a streaming context and a distributed file system for the remote reception and communication of the compressed weather data. The solutions enable the integration of the machine learning encoding/decoding techniques in different ends of the communication system, and thus allows for reduced memory or storage requirements on any of the two ends or any high bandwidth requirements on the communication channel, as well as for establishing different communication standards for each of the two ends.

The claimed solution may be employed as a service, application, program, or standard procedure for any system managing large-scale weather information, or any large data sets, to be calculated and consumed frequently. For example, the proposed solutions may be implemented as a service for air navigation service providers to share the received meteorological information from different providers between different ground stations, or for the communication of weather information between a ground station and an unmanned air vehicle or an airplane. Also, the proposed solutions may be established as standard practice for the distribution of relevant weather information with small, unmanned air vehicles when airborne that could use large-scale weather information for a particular area for their flight management calculations, e.g., to consider wind influence and other weather-related factors.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus, comprising:
a processor; and
a memory that stores code executable by the processor to:
receive a raw meteorological data set for a time frame, the raw meteorological data set comprising a plurality of dimensions;
compress the raw meteorological data set using a machine learning encoding model to create an encoded meteorological data set that has a storage size that is smaller than a storage size of the raw meteorological data set, wherein the encoded meteorological data set can be decoded to create a decoded meteorological data set that is substantially similar to the raw meteorological data set; and
make the encoded meteorological data set accessible to one or more end users.

2. The apparatus of claim 1, wherein the machine learning encoding model comprises a nonlinear machine learning model, the nonlinear machine learning model comprising one of a fully-connected autoencoder model and a convolutional autoencoder model.

3. The apparatus of claim 1, wherein the machine learning encoding model comprises a linear machine learning model, the linear machine learning model comprising a proper orthogonal decomposition model.

4. The apparatus of claim 1, wherein the code is executable by the processor to select the machine learning encoding model based on the physical characteristics of the raw meteorological data set.

5. The apparatus of claim 1, wherein the code is executable by the processor to train the machine learning encoding model using historical meteorological data.

6. The apparatus of claim 1, wherein the code is executable by the processor to associate a type of the machine learning encoding model used to create the encoded meteorological data set with the encoded meteorological data set for use in decoding the encoded meteorological data set.

7. The apparatus of claim 1, wherein the code is executable by the processor to determine a subset of the plurality of dimensions for the machine learning encoding model to encode.

8. The apparatus claim 1, wherein the code is executable by the processor to scale the raw meteorological data set with respect to second-order statistics of the raw meteorological data set prior to compressing the raw meteorological data set using the machine learning encoding model.

9. The apparatus of claim 1, wherein the code is executable by the processor to make the encoded meteorological data set accessible to one or more end users by streaming the encoded meteorological data set to the one or more end users via a distributed computing system.

10. The apparatus of claim 1, wherein the code is executable by the processor to make the encoded meteorological data set accessible to one or more end users by storing the encoded meteorological data set in a distributed file system that is accessible to the one or more end users.

11. The apparatus of claim 1, wherein the raw meteorological data set is received from a streaming source in real time and comprises at least an air velocity dimension and an air temperature dimension.

12. The apparatus of claim 1, wherein the one or more end users comprises one or more of an aircraft, a flight control system, a ground-based flight management system, and an unmanned aerial vehicle.

13. A method, comprising:
  receiving a raw meteorological data set for a time frame, the raw meteorological data set comprising a plurality of dimensions;
  compressing the raw meteorological data set using a machine learning encoding model to create an encoded meteorological data set that has a storage size that is smaller than a storage size of the raw meteorological data set, wherein the encoded meteorological data set can be decoded to create a decoded meteorological data set that is substantially similar to the raw meteorological data set; and
  making the encoded meteorological data set accessible to one or more end users.

14. The method of claim 13, wherein the machine learning encoding model comprises a nonlinear machine learning model, the nonlinear machine learning model comprising one of a fully-connected autoencoder model and a convolutional autoencoder model.

15. The method of claim 13, wherein the machine learning encoding model comprises a linear machine learning model, the linear machine learning model comprising a proper orthogonal decomposition model.

16. The method of claim 13, further comprising selecting the machine learning encoding model based on the physical characteristics of the raw meteorological data set.

17. The method of claim 13, further comprising training the machine learning encoding model using historical meteorological data.

18. The method of claim 13, further comprising associating a type of the machine learning encoding model used to create the encoded meteorological data set with the encoded meteorological data set for use in decoding the encoded meteorological data set.

19. The method of claim 13, further comprising determining a subset of the plurality of dimensions for the machine learning encoding model to encode.

20. A program product comprising a non-transitory computer readable storage medium storing code comprising instructions which, when the program product is executed by a processor, cause the processor to perform operations comprising:
  receiving a raw meteorological data set for a time frame, the raw meteorological data set comprising a plurality of dimensions;
  compressing the raw meteorological data set using a machine learning encoding model to create an encoded meteorological data set that has a storage size that is smaller than a storage size of the raw meteorological data set, wherein the encoded meteorological data set can be decoded to create a decoded meteorological data set that is substantially similar to the raw meteorological data set; and
  making the encoded meteorological data set accessible to one or more end users.

* * * * *